United States Patent
Lee

(10) Patent No.: US 7,709,914 B2
(45) Date of Patent: May 4, 2010

(54) IMAGE SENSOR WITH METAL INTERCONNECTION HAVING PROTRUDING CONVEX SHAPE WITH PHOTODIODE CONFORMALLY FOLLOWING METAL INTERCONNECTION SHAPE AND METHOD OF MANUFACTURING THE SAME

(75) Inventor: Min Hyung Lee, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 38 days.

(21) Appl. No.: 12/044,465

(22) Filed: Mar. 7, 2008

(65) Prior Publication Data

US 2008/0224243 A1 Sep. 18, 2008

(30) Foreign Application Priority Data

Mar. 14, 2007 (KR) .................. 10-2007-0024913

(51) Int. Cl.
*H01L 31/0232* (2006.01)
*H01L 31/18* (2006.01)

(52) U.S. Cl. .............. 257/432; 257/294; 257/E31.127; 438/70

(58) Field of Classification Search ......... 257/292–294, 257/432, E31.127; 438/69–71
See application file for complete search history.

(56) References Cited

U.S. PATENT DOCUMENTS

| 4,277,793 A | * | 7/1981 | Webb | .................. 257/436 |
| 4,663,188 A | | 5/1987 | Kane | |
| 6,955,986 B2 | * | 10/2005 | Li | .................. 438/687 |
| 2006/0038209 A1 | * | 2/2006 | Hashimoto | .................. 257/294 |
| 2006/0146233 A1 | * | 7/2006 | Park | .................. 349/95 |
| 2007/0184587 A1 | * | 8/2007 | You et al. | .................. 438/149 |

FOREIGN PATENT DOCUMENTS

KR 10-2004-0042830 12/2005
KR 10-2004-0115972 7/2006

* cited by examiner

*Primary Examiner*—Marcos D Pizarro
*Assistant Examiner*—Raj Gupta
(74) *Attorney, Agent, or Firm*—Saliwanchik, Lloyd & Saliwanchik

(57) ABSTRACT

An image sensor is provided. The image sensor can include a semiconductor substrate including a circuit region, an interlayer dielectric including a metal interconnection on the semiconductor substrate, a lower electrode on the metal interconnection, and a light receiving portion on the lower electrode. The light receiving portion can be a PIN diode formed to have a convex shape.

18 Claims, 3 Drawing Sheets

IMAGE SENSOR WITH METAL INTERCONNECTION HAVING PROTRUDING CONVEX SHAPE WITH PHOTODIODE CONFORMALLY FOLLOWING METAL INTERCONNECTION SHAPE AND METHOD OF MANUFACTURING THE SAME

CROSS-REFERENCE TO RELATED APPLICATION

The present application claims the benefit under 35 U.S.C. §119 of Korean Patent Application No. 10-2007-0024913, filed Mar. 14, 2007, which is hereby incorporated by reference in its entirety.

BACKGROUND

In general, an image sensor is a semiconductor device for converting optical images into electrical signals. The image sensor is mainly classified as a charge coupled device (CCD) image sensor or a complementary metal oxide silicon (CMOS) image sensor (CIS).

A CIS includes a photodiode and a MOS transistor in a unit pixel. The CIS sequentially detects electric signals of each unit pixel in a switching manner to realize an image.

The photodiode region converts a light signal into an electrical signal and the transistor processes the electrical signal. Generally, in a CIS, the photodiode and the transistor are horizontally disposed on a semiconductor substrate.

According to a horizontal type CMOS image sensor, the photodiode and the transistor are horizontally adjacent to each other on the semiconductor substrate. Therefore, an additional region within each pixel area is required for forming the photodiode.

BRIEF SUMMARY

Embodiments of the present invention relate to an image sensor that provides vertical integration of a transistor circuit and a photodiode, and a method of manufacturing the image sensor.

In one embodiment, an image sensor includes: a semiconductor substrate including a circuit region; an interlayer dielectric including a metal interconnection on the semiconductor substrate; a lower electrode on the metal interconnection; and a light receiving portion on the lower electrode. The metal interconnection can have a protruding convex portion; and the shapes of the lower electrode and the light receiving portion can follow the convex shape of the protruding portion of the metal interconnection.

A method of manufacturing an image sensor according to one embodiment includes: forming an interlayer dielectric including a metal interconnection on a semiconductor substrate including a circuit region; and forming a light receiving portion having a convex shape above the metal interconnection.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings.

Figure 7:
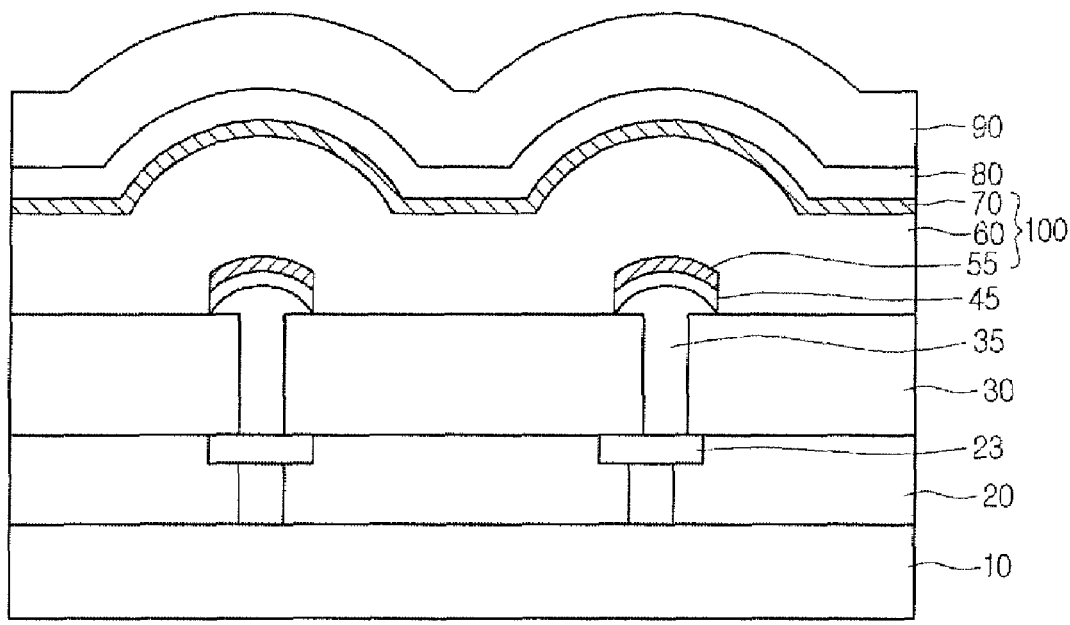

FIG. 7 is a cross-sectional view illustrating an image sensor according to an embodiment.

Referring to FIG. 7, an image sensor according an embodiment includes a lower interconnection structure 20 including a plurality of lower interconnections 23 disposed on a semiconductor substrate 10 having a circuit region (not shown).

An interlayer dielectric 30 including a metal interconnection 35 can be disposed on the lower interconnection structure 20.

In one embodiment, the metal interconnection 35 can be formed of copper (Cu). For example, the metal interconnection 35 may be formed by an electroplating process. The metal interconnection 35 can be formed to have a convex semi-spherical shape such that it protrudes from an upper portion of the interlayer dielectric 30. In another embodiment, metal interconnection 35 may be formed of a metal material such as tungsten (W).

A lower electrode 45 can be disposed on the metal interconnection 35.

The lower electrode 45 can cover a peripheral region of the metal interconnection 35 such that the metal interconnection 35 is not exposed. The lower electrode 45 may be also formed in a convex semi-spherical shape. In certain embodiments, the lower electrode 45 may be formed of Cr, Ti, TiW, or Ta. The lower electrode 45 can have a thickness of approximately 50 Å to approximately 5,000 Å.

A light receiving portion 100 can be formed on the lower electrode 45 and the interlayer dielectric 30. The light receiving portion 100 can include a first conductive layer 55 (for example, an n-type amorphous silicon layer), an intrinsic layer 60 (for example, an intrinsic amorphous silicon layer), and a second conductive layer 70 (for example, a p-type amorphous silicon layer).

The first conductive layer 55 may be disposed on only the lower electrode 45 in a convex semi-spherical shape. The first conductive layer 55 can separate the image pixel regions because the first conductive layer 55 is disposed only the metal interconnection 35 and the lower electrode 45. Accordingly, a cross talk and a noise may be reduced by separating the light receiving portion into each unit pixel by the first conductive layer 55 that is provided only on the lower electrode 45. In one embodiment, the first conductive layer 55 can be formed by an implantation of n-type impurities into a silicon layer or by a deposition process in a thickness of approximately 50 Å to approximately 5,000 Å.

The intrinsic layer 60 may be disposed on the first conductive layer 55 and the interlayer dielectric 30 in a thickness of approximately 1,000 Å to approximately 10,000 Å.

The second conductive layer 70 may be disposed on the intrinsic layer 60 by an implantation of p-type impurities or by a deposition process in a thickness of approximately 10 Å to approximately 5,000 Å.

The intrinsic layer 60 and the second conductive layer 70 are disposed on the first conductive layer 55 convexly protruding from the interlayer dielectric 30. Accordingly, the intrinsic layer 60 and the second conductive layer 70 may be disposed over the first conductive layer 55 in a convex semi-spherical shape.

Therefore, the light receiving portion 100 in the form of a PIN diode can be disposed on the metal interconnection 35 in such a convex shape that a light transmittance and a light focusing rate may be improved.

A transparent electrode layer 80 serving as an upper electrode can be disposed on the light receiving portion 100. The transparent electrode layer 80 may be formed of an Indium Tin oxide (ITO) in a thickness of approximately 10 Å to approximately 1,000 Å.

In an embodiment, a color filter array 90 capable of selectively transmitting light can be disposed on the transparent electrode layer 80.

The transparent electrode layer 80 and the color filter array 90 can be disposed on the receiving portion 100 having the convex semi-spherical shape in each image pixel. Accordingly, the transparent electrode layer 80 and the color filter array 90 are also formed in a convex semi-spherical shape at a portion corresponding to the unit pixel, thereby improving the focusing rate of light incident from the outside.

Hereinafter, a process of manufacturing an image sensor according to an embodiment will be described with reference to FIGS. 1 to 7.

Figure 1:
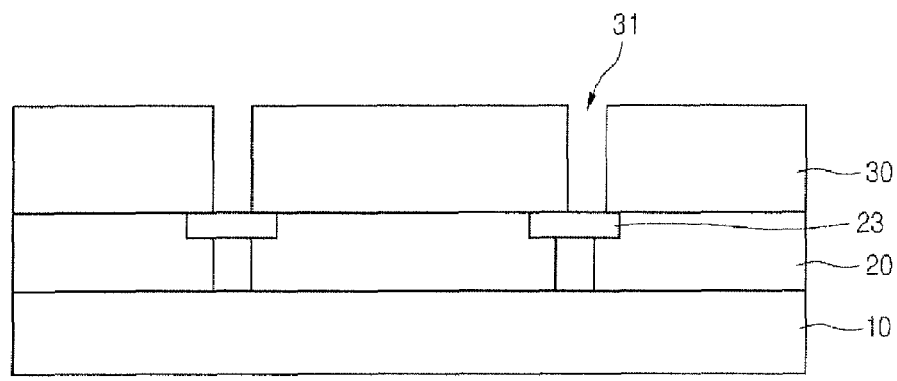
FIGS. 1 to 7 are cross-sectional views illustrating a process of manufacturing an image sensor according to an embodiment.

Referring to FIG. 1, a lower interconnection structure 20 including a circuit region (not shown) and a plurality of interconnection layers can be formed on a semiconductor substrate 10.

Before forming the lower interconnection structure, a device separating (or isolating) layer (not shown) may be formed on the semiconductor substrate 10 defining an active region and a field region. A transistor structure (not shown) may be formed on the semiconductor substrate 10 to form a unit pixel. In one embodiment, the transistor structure can include a transfer transistor, a reset transistor, a driver transistor, and a select transistor. The transistor structure connects to a light receiving portion 100 formed above the transistor structure to convert photocharges incident from the outside into electrical signals.

The lower interconnection structure 20 including a lower interconnection 23 can be formed on the semiconductor substrate 10. The lower interconnection structure 20 may be in a multi-layer so as to connect a power source line or a signal line to the circuit region. For example, the lower interconnection structure 20 may be formed using a combination of insulating layers and conductive layers. The conductive layers, including the lower interconnection 23, can be formed using aluminum, copper, cobalt or tungsten. The lower interconnection structure formed between the lower interconnections 23 may be formed of, for example, an oxide layer or a nitride layer.

An interlayer dielectric 30 can be formed on the lower interconnection structure 20. A via hole 31 penetrating the interlayer dielectric 30 is formed in the interlayer dielectric 30 so as to expose a surface of the lower interconnection 23. For example, the via hole 31 may be formed by a single or dual damascene process.

Figure 2:
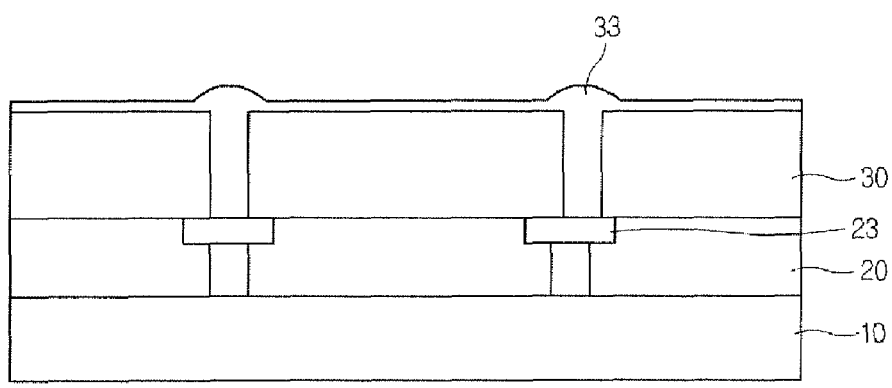

Referring to FIG. 2, a conductive layer 33 can be formed on the interlayer dielectric 30 including the via hole 31. For example, the conductive layer 33 can be formed of copper by using an electroplating process. Accordingly, the via hole 31 may be filled with a copper layer 33.

Although not illustrated in the figure, a diffusion protection layer for inhibiting a diffusion of copper and a seed layer for an easy deposition of the copper layer 33 may be formed on an inner surface of the via hole 31 before the deposition of the copper layer 33.

An additive such as bis(sodiumsulfopropyl) disulfide (SPS) or polyethylene glycol (PEG) may be controllably added during the electroplating process for forming the copper layer 33. In this way, the via hole 31 may be filled with copper without a void. Furthermore, according to embodiments, the copper layer 33 is formed in a convexly protruding shape over the via hole 31 as illustrated in FIG. 2. This can be accomplished by filling the via hole 31 in a bottom-up manner due to a plating speed at the inside of the via hole 31 greater than that at the outside of the via hole 31 during the electroplating process.

Figure 3:
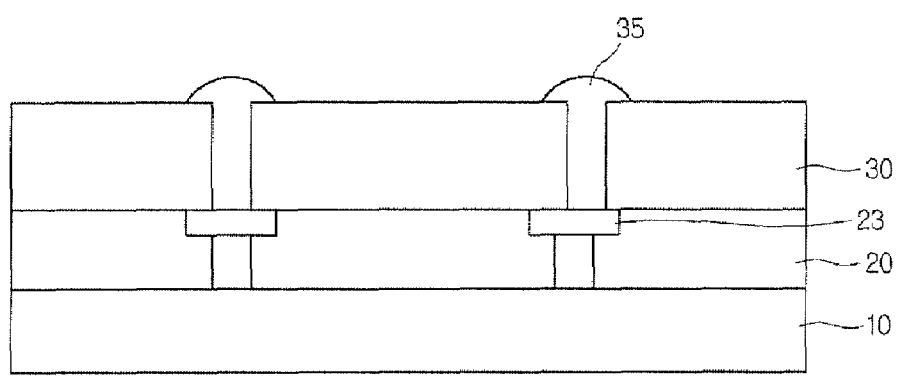

Referring to FIG. 3, a metal interconnection 35 is formed electrically connected to the lower interconnection 23. The metal interconnection 35 may be formed to be only within and on the via hole 31. The metal interconnection 35 may be formed by removing the copper layer 33 remaining on the interlayer dielectric 30 except for on the copper layer 33 buried in the via hole 31. For example, the metal interconnection 35 may be formed by removing regions of the copper layer 33 on the interlayer dielectric 30 except for the convex region of the copper layer 33. This can be performed through a wet etching process after providing a photoresist pattern covering the convex regions of the copper layer 33. In this way, the metal interconnection 35 can remain having a protruding convex shape on the via hole 31.

In certain embodiments, the metal interconnection 35 may be formed of tungsten by forming the conductive layer 33 using tungsten.

A lower electrode 45 and a light receiving portion 100 can be subsequently formed on the interlayer dielectric 30 in which the metal interconnection 35 is formed.

Figure 4:
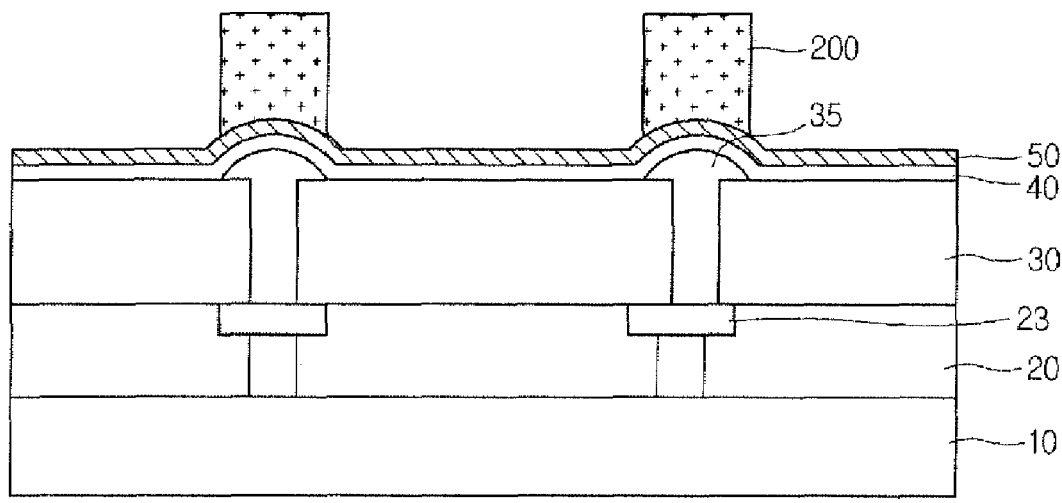

Referring to FIG. 4, the lower electrode 45 may be formed by depositing one of Cr, Ti, TiW, and Ta using a physical vapor deposition (PVD) process. The lower electrode 45 can be used to enclose the perimeter of the metal interconnection 35 so as not to expose the metal interconnection 35.

The light receiving portion 100 can be formed on the lower electrode 45 and the interlayer dielectric 30 to serve as a photodiode for converting light incident from the outside into an electrical form and storing the electrical form. The light receiving portion 100 according to this embodiment utilizes a PIN diode.

In one embodiment, the PIN diode includes an n-type amorphous silicon layer 50, an intrinsic amorphous silicon layer 60, and a p-type amorphous silicon layer 70. For the PIN diode, the entire depletion layer formed between the p-type silicon layer and the n-type silicon layer is completely contained in the intrinsic semiconductor layer. Furthermore, the greater the thickness of the depletion layer, the more charge generation and storage capabilities are available. Accordingly, a photodiode having an optimal characteristic may be manufactured by controlling the thickness of the intrinsic semiconductor layer.

Hereinafter, a process of forming the light receiving portion 100 according to an embodiment of the present invention will be described.

Referring again to FIG. 4, a lower electrode layer 40 can be formed on the interlayer dielectric 30 including the metal interconnection 35. A first conductive-type conduction layer 50 can be formed on the lower electrode layer 40.

In an embodiment, the lower electrode layer 40 may be formed of Cr. The lower electrode layer 40 may be formed to have a thickness of approximately 50 Å to approximately 5,000 Å.

In one embodiment, the first conductive type conduction layer 50 can be formed by a chemical vapor deposition (CVD) process. For example, the first conductive type conduction layer 50 may be formed in a thickness of approximately 50 Å to approximately 5,000 Å by mixing $SiH_4$, $PH_3$, or $P_2H_5$ gas through a plasma enhanced CVD (PECVD) process.

The lower electrode layer 40 and the first conductive type conduction layer 50 formed above the interlayer dielectric 30 including the metal interconnection 35 can have a convex shape at a region corresponding to the metal interconnection 35.

Thereafter, a photoresist pattern 200 can be provided on the first conductive type conduction layer 50 at an area corresponding to an area of the metal interconnection 35 to form a unit pixel of an image sensor.

Figure 5:
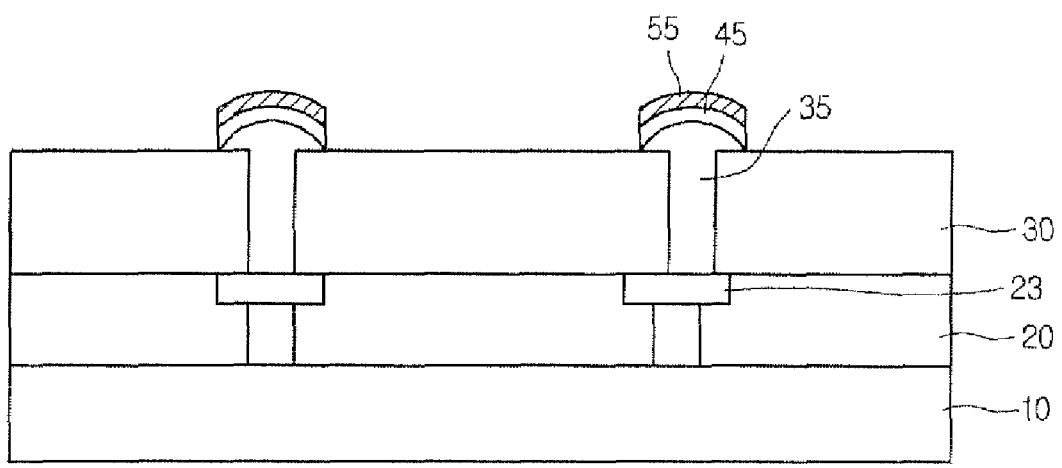

Referring to FIG. 5, the first conductive type conduction layer 50 and the lower electrode layer 40 can be etched using the photoresist pattern 200 as an etching mask. Subsequently, a lower electrode 45 and a first conductive type pattern 55 are formed only on the metal interconnection 35 connected to the circuit region to form the unit pixel of the image sensor, which includes the circuit region (not shown) and a photodiode (100).

In this case, the photoresist pattern 200 may be formed in a greater width than a width of the metal interconnection 35, so that the lower electrode 45 and the first conductive type pattern 55 may completely cover the surface of the metal interconnection 35. Accordingly, diffusion of copper, which may be used to form the metal interconnection 35, can be inhibited from occurring because the surface of the metal interconnection 35 is not exposed.

Moreover, the lower electrode 45 and the first conductive pattern 55 can be also formed in a convex shape because the metal interconnection 35 convexly protrudes from the surface of the interlayer dielectric 30.

Figure 6:
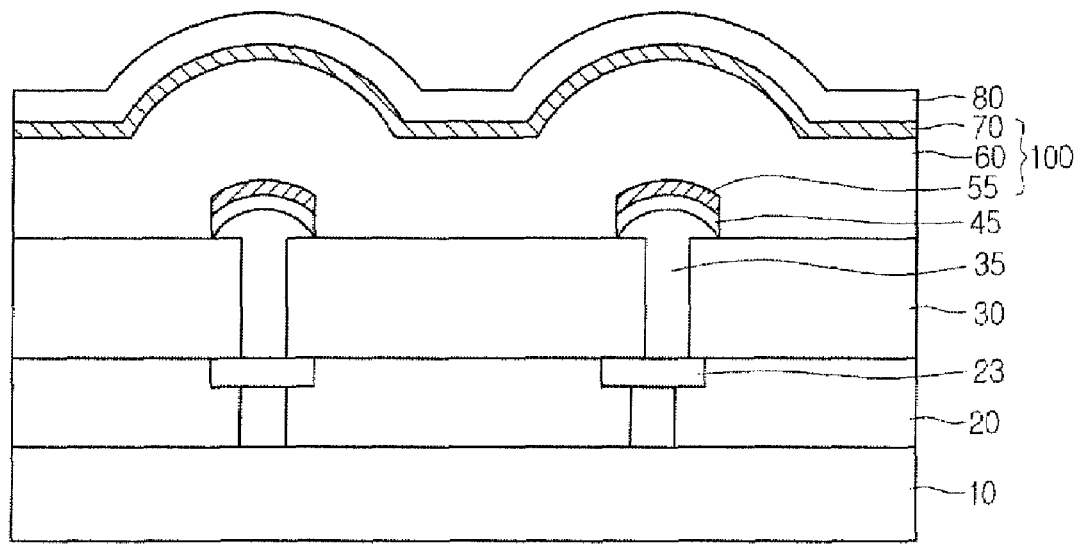

Referring to FIG. 6, an intrinsic layer 60 and a second conductive type conduction layer 70 can be sequentially formed on the first conductive type pattern 55 and the interlayer dielectric 30. Accordingly, a light receiving portion 100 including the first semiconductor conductive type pattern 55, the intrinsic layer 60 and the second conductive type conduction layer 70 is formed. In this case, the intrinsic layer 50 and the second conductive type conduction layer 70 have a convex semi-spherical shape as a whole because the first conductive type pattern 55 convexly protrudes from the surface of the interlayer dielectric 30.

In one embodiment, the intrinsic layer 60 can be formed to a thickness of approximately 1,000 Å to approximately 10,000 Å by depositing $SiH_4$ gas using a CVD process.

The second conductive type conduction layer 70 can then be formed using, for example, a CVD process. For example, the second conductive type conduction layer 70 may be formed in a thickness of approximately 10 Å to approximately 5,000 Å by mixing $SiH_4$, $BH_3$ or $B_2H_6$ gas at a temperature of approximately 100° C. to approximately 400° C. using a PECVD process.

As described above, charge storing capability of the light receiving portion 100 can be enhanced because the thickness of the intrinsic layer 60 is greater than the thicknesses of the first conductive type pattern 55 and the second conductive type conduction layer 70.

In addition, the light focusing rate of the light receiving portion 100 can be improved because the unit pixel of the light receiving portion 100 has a convex semi-spherical shape similar to the shape of a microlens.

In a further embodiment, a transparent electrode layer 80 can be formed on the second conductive type conduction layer 70 to serve as an upper electrode. For example, the transparent electrode layer 80 is formed in a thickness of approximately 100 Å to approximately 1,000 Å by depositing Indium Tin oxide (ITO).

Referring to FIG. 7, a color filter array 90 may be formed on the transparent electrode layer 80 to realize a color image. In addition, a microlens (not shown) may be formed on the color filter array 90.

An image sensor and a method of manufacturing the same according to this disclosure have an effect of maximizing light transmittance into a light receiving portion by forming a PIN diode as the light receiving portion above a metal interconnection.

Moreover, the image sensor and the method of manufacturing the same according to embodiments of the invention can improve the light focusing rate on the light receiving portion because the light receiving portion has a convex semi-spherical shape similar to a microlens of a typical CMOS image sensor. Accordingly, since a separate microlens is not required, the manufacturing process becomes simple, thereby saving the manufacturing cost.

Furthermore, the charge storing capability and the light focusing rate of the light receiving portion can be improved by using the PIN diode and increasing an area of an intrinsic amorphous silicon layer of the PIN diode.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate;
   an interlayer dielectric including a metal interconnection on the semiconductor substrate; and
   a light receiving photodiode portion above the metal interconnection, wherein the light receiving photodiode portion has a convex shape;
   wherein the metal interconnection has a convex shape protruding from the interlayer dielectric, wherein the convex shape of the light receiving photodiode portion follows the protruding convex shape of the metal interconnection.

2. The image sensor according to claim 1, wherein the light receiving photodiode portion comprises a first conductive type pattern, an intrinsic layer, and a second conductive conduction layer.

3. The image sensor according to claim 1, further comprising a lower electrode on the metal interconnection between the light receiving photodiode portion and the metal interconnection.

4. The image sensor according to claim 3, wherein the lower electrode has a convex shape.

5. The image sensor according to claim 1, further comprising
- an upper electrode on the light receiving photodiode portion; and
- a color filter array on the upper electrode.

6. The image sensor according to claim 5, wherein the upper electrode and the color filter array each has a convex shape following the convex shape of the light receiving photodiode portion.

7. The image sensor according to claim 5, wherein the upper electrode comprises a transparent electrode.

8. A method of manufacturing an image sensor, comprising:
- forming an interlayer dielectric including a metal interconnection on a semiconductor substrate; and
- forming a light receiving photodiode portion having a convex shape above the metal interconnection;
- where in the forming of the interlayer dielectric including the metal interconnection comprises forming the metal interconnection within the interlayer dielectric such that a portion of the metal interconnection protrudes in a convex shape above a top surface of the interlayer dielectric, wherein the convex shape of the light receiving photodiode portion follows the convex shape of the protruding port of the metal interconnection.

9. The method according to claim 8, further comprising forming a lower electrode on the metal interconnection before forming the light receiving photodiode portion.

10. The method according to claim 8, wherein the forming of the interlayer dielectric including the metal interconnection comprises performing a damascene process.

11. The method according to claim 8, further comprising:
- forming an upper electrode on the light receiving photodiode portion; and
- forming a color filter on the upper electrode.

12. The method according to claim 8, wherein the forming of the light receiving photodiode portion comprises:
- forming a first conductive type pattern in a convex shape above the metal interconnection;
- forming an intrinsic layer on the first conductive type pattern; and
- forming a second conductive type conduction layer on the intrinsic layer.

13. The method according to claim 12, wherein the forming of the intrinsic layer comprises depositing the intrinsic layer on the interlayer dielectric and the first conductive type pattern.

14. The method according to claim 12, wherein the forming of the second conductive type conduction layer comprises depositing the second conductive type conduction layer on the intrinsic layer.

15. The method according to claim 12, wherein the forming of the first conductive type pattern in the convex shape above the metal interconnection comprises:
- depositing a metal layer on the interlayer dielectric including the metal interconnection;
- depositing a first conductive type conduction layer on the metal layer;
- forming a photoresist pattern on the first conductive type conduction layer covering a region of the first conductive type conduction layer above the metal interconnection; and
- etching the first conductive type conduction layer and the metal layer using the photoresist pattern as an etch mask, thereby forming a lower electrode and the first conductive type pattern.

16. The method according to claim 15, wherein the lower electrode and the first conductive type pattern are formed only on the metal interconnection.

17. A method of manufacturing an image sensor, comprising:
- forming an interlayer dielectric including a metal interconnection on a semiconductor substrate; and
- forming a light receiving photodiode portion having a convex shape above the metal interconnection;
- wherein the forming of the interlayer dielectric including the metal interconnection comprises performing a damascene process;
- wherein the forming of the interlayer dielectric including the metal interconnection further comprises:
- forming a copper layer in a via hole formed by the damascene process using an electroplating process, and
- removing a portion of the copper layer on a surface of the interlayer dielectric except for a region above the via hole using a wet etching process, so that copper remains extending upward from the via hole in a convex shape.

18. The method according to claim 11, wherein the upper electrode comprises a transparent electrode.

* * * * *